(12) United States Patent
Lee et al.

(10) Patent No.: US 11,762,238 B2
(45) Date of Patent: Sep. 19, 2023

(54) PRINTED CIRCUIT, BACKLIGHT UNIT AND DISPLAY DEVICE

(71) Applicant: LG Display Co., Ltd., Seoul (KR)

(72) Inventors: Kyuhwan Lee, Paju-si (KR); SangChul Ryu, Paju-si (KR); DongSeok Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 17/497,463

(22) Filed: Oct. 8, 2021

(65) Prior Publication Data
US 2022/0128865 A1   Apr. 28, 2022

(30) Foreign Application Priority Data
Oct. 26, 2020   (KR) .................... 10-2020-0139659

(51) Int. Cl.
*G02F 1/1335* (2006.01)
*H05K 1/02* (2006.01)
*G02F 1/13357* (2006.01)

(52) U.S. Cl.
CPC .. *G02F 1/133612* (2021.01); *G02F 1/133603* (2013.01); *H05K 1/0298* (2013.01); *H05K 2201/10106* (2013.01); *H05K 2201/10128* (2013.01)

(58) Field of Classification Search
CPC ......... G02F 1/133612; G02F 1/133603; G02F 1/13306; G02F 1/133602; H05K 1/0298; H05K 1/0306; H05K 1/181; H05K 1/0274; H05K 2201/10106; H05K 2201/10128; H05K 3/388; H05K 3/4644; H05K 3/4652; H05K 3/4664; H05K 3/46; G02B 6/0068; H10K 50/156; H10K 50/166
See application file for complete search history.

(56) References Cited

U.S. PATENT DOCUMENTS

2015/0319868 A1* 11/2015 Wei ..................... H05K 3/4661
                                                                    174/255

FOREIGN PATENT DOCUMENTS

WO   WO-03032701 A1 *  4/2003  ........... H05K 3/4652

OTHER PUBLICATIONS

Machine translation of WO 03032701 A1 (Year: 2003).*

* cited by examiner

*Primary Examiner* — Matthew Mikels
*Assistant Examiner* — Jose M Diaz
(74) *Attorney, Agent, or Firm* — Fenwick & West LLP (57) ABSTRACT

Embodiments of the present disclosure relate to a printed circuit, a backlight unit, and a display device. The printed circuit on which a light source is mounted can be easily manufactured in a single form, by depositing and arranging a wiring layer on a substrate and mounting the light source on the wiring layer. Further, the printed circuit is arranged so that the wiring layer includes a plurality of bonding metal layers and a plurality of wiring metal layers, and a part of the bonding metal layer positioned between the plurality of wiring metal layers and disposed in an area overlapping a pad portion of the light source is removed. Therefore, even though the main metal layer of the wiring layer is removed during reworking, it is possible to provide the printed circuit capable of electrically connecting to the light source by the sub-metal layer of the wiring layer.

17 Claims, 10 Drawing Sheets

PRINTED CIRCUIT, BACKLIGHT UNIT AND DISPLAY DEVICE

CROSS-REFERENCE TO RELATED APPLICATION

This application claims priority from Korean Patent Application No. 10-2020-0139659, filed on Oct. 26, 2020, which is hereby incorporated by reference for all purposes as if fully set forth herein.

BACKGROUND

Field

The present disclosure relates to a printed circuit, a backlight unit and a display device.

Description of Related Art

Along with the recent advent of the information society, the demand for display devices for displaying images is ever increasing, and various types of display devices such as e.g., a liquid crystal display device and an organic light emitting display device are utilized.

Such a liquid crystal display device may include a display panel having a liquid crystal layer, and a backlight unit for supplying light to the display panel.

The backlight unit may include a plurality of light sources and various optical members for efficiently supplying light emitted from the light sources to the display panel. The plurality of light sources may be included in the backlight unit with a form of being mounted on a printed circuit, for example.

At this juncture, any defect may occur in the process of mounting the light source onto the printed circuit. As such, in case where a defective mounting of the light source is caused, it will naturally lead to difficulties in replacing the printed circuit itself or performing the entire manufacturing process of the printed circuit again, due to the difficulty of rework.

SUMMARY

Various embodiments of the present disclosure provide a method for easily manufacturing a printed circuit on which a light source included in a backlight unit is mounted.

Various embodiments of the present disclosure provide a method for removing any defective light source and then mounting the light source again on the printed circuit through a rework, when any defect occurs in the process of mounting the light source on the printed circuit.

In one aspect, embodiments of the present disclosure provide a backlight unit including a plurality of light sources and a printed circuit on which the plurality of light sources are mounted and including one or more wiring layers.

At least one of the one or more wiring layers included in the printed circuit may include a main metal layer, a sub-metal layer disposed underneath the main metal layer, and a bonding metal layer disposed between the main metal layer and the sub-metal layer, a portion of which is removed in an area overlapping each of the plurality of light sources.

The bonding metal layer may be located in some of the area overlapping each of the plurality of light sources. Accordingly, in the area overlapping each of the plurality of light sources, a region in which the bonding metal layer is disposed and a region in which no bonding metal layer is disposed may exist.

At least a portion of the main metal layer may be removed in the area overlapping at least one light source of the plurality of light sources.

A portion of the sub-metal layer located in the area overlapping the bonding metal layer in the area overlapping at least one light source of the plurality of light sources may be in an alloy state.

At least one light source of the plurality of light sources included in the backlight unit may be in contact with the main metal layer, and at least one other light source of the plurality of light sources may be in contact with the sub-metal layer.

Further, at least one light source of the plurality of light sources included in the backlight unit may be in contact with the bonding metal layer.

In another aspect, embodiments of the present disclosure provide a display device including the aforementioned backlight unit and a display panel positioned on the backlight unit and receiving light from the backlight unit.

In still another aspect, embodiments of the present disclosure provide a printed circuit including a substrate and one or more wiring layers disposed on the substrate, at least one of the one or more wiring layers including a first bonding metal layer, a sub-metal layer disposed on the first bonding metal layer, a second bonding metal layer disposed on the sub-metal layer, and a main metal layer disposed on the second bonding metal layer.

In the printed circuit, the first bonding metal layer may be entirely disposed underneath the sub-metal layer, and the second bonding metal layer may be removed in some area between the main metal layer and the sub-metal layer.

According to embodiments of the present disclosure, a printed circuit on which a light source is mounted can be manufactured by means of depositing a wiring layer and a wiring insulating layer on a substrate, so that the light source can be efficiently mounted on the printed circuit in a single formation despite an increased area of a display panel.

According to embodiments of the present disclosure, in an area where the light source is mounted, the wiring layer included in the printed circuit includes the main metal layer and the sub-metal layer, and it is possible to dispose the bonding metal layer with its part removed between the main metal layer and the sub-metal layer. Accordingly, even in case where a rework has to be performed due to a defective mounting of the light source, the light source may be electrically connected via the sub-metal layer even if the main metal layer is removed.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Figure 1:
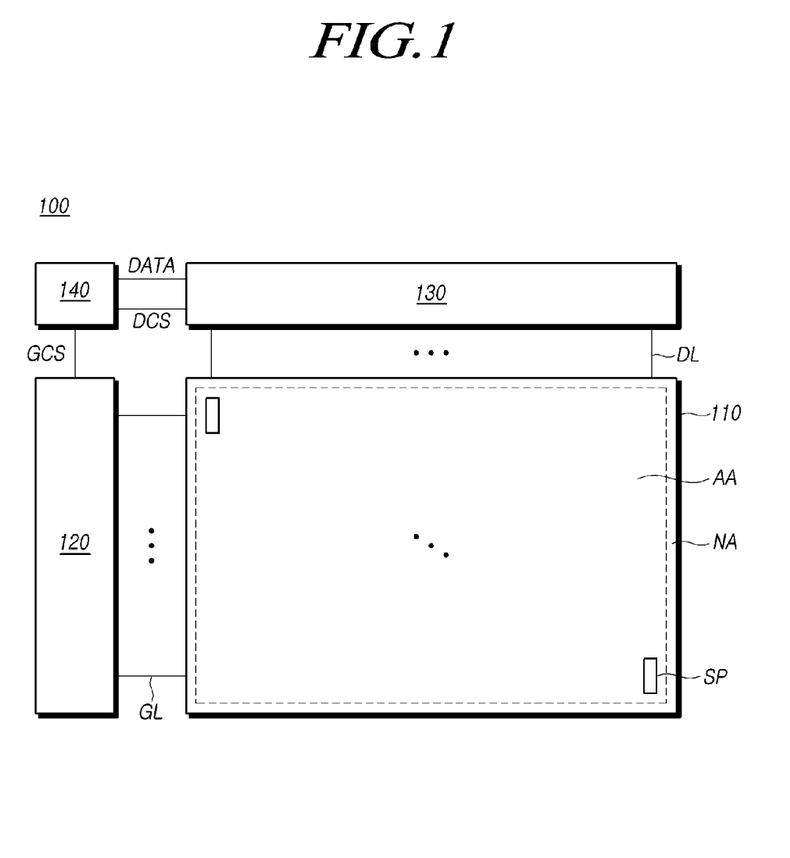
FIG. 1 is a diagram schematically showing the configuration of a display device according to embodiments of the present disclosure.

FIG. 1 is a diagram schematically showing the configuration of a display device 100 according to embodiments of the present disclosure.

Referring now to FIG. 1, the display device 100 may include a display panel 110, a gate driving circuit 120, a data driving circuit 130, a controller 140 for driving the display panel 110, and the like.

The display panel 110 may include an active area AA in which a plurality of subpixels SP are disposed, and a non-active area NA positioned outside the active area AA.

In the display panel 110 may be disposed a plurality of gate lines GL and a plurality of data lines DL, and a subpixel SP may be arranged in a region where the gate line GL and the data line DL intersect.

The gate driving circuit 120 may be controlled by the controller 140, and sequentially output a scan signal to the plurality of gate lines GL disposed on the display panel 110 to control the driving timing of the plurality of sub-pixels SP.

The gate driving circuit 120 may include one or more gate driver integrated circuits (GDIC) and may be located on either one side of the display panel 110 or both sides of the display panel 110, depending upon its driving scheme.

Each gate driver integrated circuit may be connected to a bonding pad of the display panel 110 by a tape automated bonding (TAB) or a chip-on-glass (COG) method, or may be implemented in a gate-in-panel (GIP) type to be disposed directly onto the display panel 110, or may be integrated to be disposed on the display panel 110 as circumstances demand. Further, each gate driver integrated circuit may be implemented in a chip-on-film (COF) method for mounting on a film connected to the display panel 110.

The data driving circuit 130 may receive image data from the controller 140 and convert the image data into analog data voltages. In addition, the data voltage may be output to each data line DL according to a timing when a scan signal is applied via the gate line GL, so that each subpixel SP expresses brightness according to image data.

The data driving circuit 130 may include one or more source driver integrated circuits (SDICs).

Each source driver integrated circuit (SDIC) may include a shift register, a latch circuit, a digital-to-analog converter, an output buffer, and the like.

A respective source driver integrated circuit (SDIC) may be connected to a bonding pad of the display panel 110 by means of a tape automated bonding (TAB) or a chip-on-glass (COG) method, or directly disposed on the display panel 110, or may be integrated and disposed on the display panel 110 as circumstances require. Further, the respective source driver integrated circuit (SDIC) may be implemented in a chip-on-film (COF) method, in which case each source driver integrated circuit (SDIC) may be mounted on a film connected to the display panel 110 and then electrically connected to the display panel 110 through wiring on the film.

The controller 140 may supply various control signals to the gate driving circuit 120 and the data driving circuit 130 in order to control the operations of the gate driving circuit 120 and the data driving circuit 130.

The controller 140 may be mounted on a printed circuit board, a flexible printed circuit or the like, and may be electrically connected to the gate driving circuit 120 and the data driving circuit 130 via the printed circuit board, the flexible printed circuit, or the like.

The controller 140 may cause the gate driving circuit 120 to provide a scan signal according to the timing implemented in each frame, and convert external received image data to the image data to be used by the data driving circuit 130 and then deliver the converted image data to the data driving circuit 130.

The controller 140 may receive various timing signals such as e.g., a vertical synchronization signal (VSYNC), a horizontal synchronization signal (HSYNC), an input data enable signal (DE: Data Enable), and a clock signal (CLK), as well as the image data, from an outside system (e.g. a host system).

The controller 140 may generate various control signals using the various timing signals received from the outside system to provide them to the gate driving circuit 120 and the data driving circuit 130.

For example, the controller 140 may output various gate control signals (GCS) including a gate start pulse (GSP), a gate shift clock (GSC), a gate output enable (GOE) signal and so on, in order to control the gate driving circuit 120.

The gate start pulse (GSP) may serve to control the operation start timing of one or more gate driver integrated circuits (GDIC) forming the gate driving circuit 120. The gate shift clock (GSC) is a clock signal commonly input to one or more gate driver integrated circuits, and may control the shift timing of the scan signal. The gate output enable signal (GOE) may specify timing information of one or more gate driver integrated circuits.

Further, in order to control the data driving circuit 130, the controller 140 may output various data control signals (DCS) including a source start pulse (SSP), a source sampling clock (SSC), a source output enable (SOE) signal, and so on.

The source start pulse (SSP) may serve to control the data sampling start timing of one or more source driver integrated circuits (SDIC) forming the data driving circuit 130. The source sampling clock (SSC) is a clock signal to control the sampling timing of data in each of the source driver integrated circuits. The source output enable (SOE) signal may control the output timing of the data driving circuit 130.

The display device 100 may further include a power management integrated circuit for supplying various voltages or currents to the display panel 110, the gate driving circuit 120, the data driving circuit 130, and so on, or for controlling various voltages or currents to be supplied thereto.

A liquid crystal layer or a light emitting device may be disposed in each of the plurality of subpixels SP, depending on the type of the display device 100. For a liquid crystal display device with a liquid crystal layer being disposed in the subpixel SP, the display device 100 may include a backlight unit for supplying light to the display panel 110.

Figure 2:
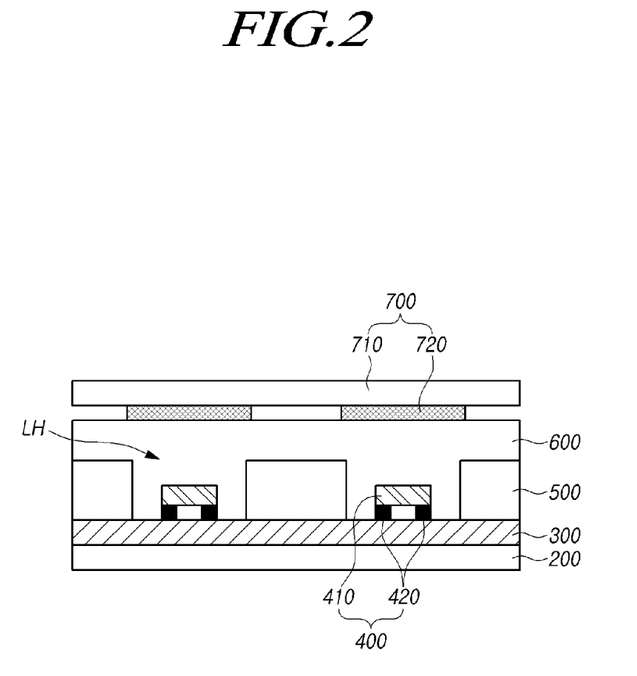
FIG. 2 is a diagram illustrating an example of a cross-sectional structure of a backlight unit according to embodiments of the present disclosure.

FIG. 2 is a diagram illustrating an example of a cross-sectional structure of a backlight unit according to embodiments of the present disclosure.

Referring now to FIG. 2, the backlight unit may include a plurality of light sources 400 and various optical members.

The plurality of light sources 400 may be mounted on a printed circuit 300.

The printed circuit 300, on which the light source 400 is mounted, and various optical members may be accommodated by a cover bottom 200.

The light source 400 may be, for example, a light emitting diode, such as e.g., a mini-light emitting diode having a size of several hundreds of μm or a micro-light emitting diode having a size of several tens of μm.

Each of the plurality of light sources 400 may include a light emitting section 410 that emits light, and a pad section 420 connected to a wiring supplying an electrical signal to the light source 400.

A reflective layer 500 may be disposed on at least a partial area of the printed circuit 300 where no light source 400 is arranged.

The reflective layer 500, for example, may be in the form of a plate, and may include a plurality of holes LH positioned in regions corresponding to each of the plurality of light sources 400. The reflective layer 500 including the plurality of holes LH may be disposed on the printed circuit 300 on which the light source 400 is mounted.

When the size of the light source 400 is relatively small, the height of the upper end of the reflective layer 500 may be greater than the height of the upper end of the light source 400.

Alternatively, in some cases, the reflective layer 500 may be disposed in a coated form on the uppermost surface of the printed circuit 300. In such a case, the height of the upper end of the reflective layer 500 may be smaller than the height of the upper end of the light source 400.

When the light emitted from the light source 400 is scattered or reflected in a backward direction, the reflective layer 500 may cause the light reaching the reflective layer 500 to be reflected back toward the display panel 110, so as to increase the efficiency of the light in the backlight unit.

A light source protection unit 600 may be disposed on the light source 400 and the reflective layer 500.

The light source protection unit 600 may be formed, for example, with a resin molding. Alternatively, it may be formed using an adhesive material such as e.g., optical clear adhesive (OCA), but is not limited thereto.

The light source protection unit 600 may surround the light source 400, but in some cases, an air layer may exist in between the light source 400 and the light source protection unit 600.

The light source protection unit 600 may protect the light source 400 and perform a function of guiding the light emitted from the light source 400.

A light path control film 700 may be disposed on the light source protection unit 600.

The light path control film 700 may include a base film 710 and a plurality of light path control patterns 720 disposed on at least one surface of the base film 710.

The base film 700 may be made of a material having high transparency, and may be made of, for example, PC (Polycarbonate) or PET (Polyethylene Terephthalate), but is not limited thereto.

Each of the plurality of light path control patterns 720 may be disposed in a region corresponding to each of the plurality of light sources 400.

The area of the light path control pattern 720 may be larger than that of the light source 400, for example.

The area of the light path control pattern 720 may be the same as the area of the hole LH included in the reflective layer 500, for example.

Alternatively, depending on the distance between the light source 400 and the light path control pattern 720, the area of the light path control pattern 720 may be either larger or smaller than the area of the hole LH included in the reflective layer 500.

The light path control pattern 720 may be made of a material having high reflective properties, such as e.g., TiO2.

The light path control pattern 720 may cause part of the light emitted from the light source 400 to transmit, or cause most of the light to undergo reflection, diffraction, or scattering.

The light reflected by the light path control pattern 720 may be reflected back by the reflective layer 500. The light reflected by the reflective layer 500 may be emitted toward the display panel 110 in a region between the light sources 400.

As such, the luminance uniformity of the backlight unit can be greatly improved by dispersing light in a region with a large amount of light while increasing the light supplied to a region with a small amount of light.

Various optical members may be disposed on the light path control film 700, and for example, a color conversion sheet, a diffusion plate, a prism sheet, a diffusion sheet, and the like may be disposed.

According to the embodiments of the present disclosure, it is possible to improve the uniformity of luminance and the light efficiency represented by the backlight unit, even if the area of the display panel 110 is increased due to the structure in which the light path control film 700 is disposed over the light source 400.

Therefore, it is possible to improve the image quality represented by the backlight unit while reducing the thickness of the backlight unit.

In the meantime, as the area of the display panel 110 increases, multiple printed circuits 300, on which the light sources 400 included in the backlight unit are mounted, may be required. That is, due to the limited size of the printed circuit 300, multiple printed circuits 300 may be required to mount the light sources 400, thereby leading to difficulties in the manufacturing process.

Embodiments of the present disclosure provide a method for implementing the printed circuit 300 for mounting the light sources 400 included in the backlight unit, in a single form.

Figure 3:
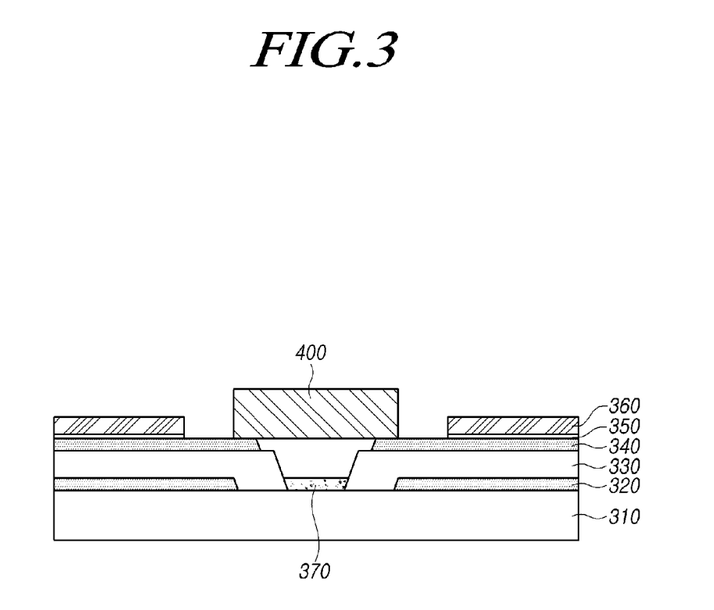
FIG. 3 is a diagram illustrating an example of a structure of a printed circuit included in a backlight unit according to embodiments of the present disclosure.

FIG. 3 is a diagram illustrating an example of the structure of a printed circuit 300 included in a backlight unit according to embodiments of the present disclosure.

Referring now to FIG. 3, the printed circuit 300 may include a substrate 310 and at least one wiring layer 320 and 340 disposed on the substrate 310.

The substrate 310 may be made of, for example, glass, but is not limited thereto.

A first wiring layer 320 may be deposited and disposed on the substrate 310. The first wiring layer 320 may include at least one metal layer.

The first wiring layer 320 may be used for electrical connection between the light source 400 and a circuit for driving the light source 400.

A wiring insulating layer 330 may be disposed on the first wiring layer 320. The wiring insulating layer 330 may be formed of either OC (Overcoat) or PAC (Photo Acryl), but is not limited thereto.

A second wiring layer 340 may be disposed on the wiring insulating layer 330.

The wiring insulating layer 330 may serve to insulate the first wiring layer 320 and the second wiring layer 340 from each other.

The uppermost surface of the wiring insulating layer 330 may be planarized to facilitate the arrangement of the second wiring layer 340.

The second wiring layer 340 may be deposited and may include at least one metal layer. At least a portion of the metal layer included in the second wiring layer 340 may be the same as the metal layer included in the first wiring layer 320.

The second wiring layer 340 may be used for electrical connection between the light source 400 and the first wiring layer 320.

A first passivation layer 350 and a second passivation layer 360 may be disposed on some area on the second wiring layer 340.

The first passivation layer 350 and the second passivation layer 360 may be disposed in an area other than the area where the light source 400 is disposed. The area in which the first passivation layer 350 is disposed and the area in which the second passivation layer 360 is disposed may be the same or different from each other.

The first passivation layer 350 may be made of, for example, SiNx, but is not limited thereto. The second passivation layer 360 may be formed of, for example, a photo solder resist (PSR), but is not limited thereto.

The first passivation layer 350 and the second passivation layer 360 may serve to prevent corrosion of the second wiring layer 340. Further, the first passivation layer 350 and the second passivation layer 360 may be removed from the area where the light source 400 is disposed, so that the second wiring layer 340 and the light source 400 may be electrically connected to each other.

The light source 400 may be mounted on the second wiring layer 340.

A portion of the wiring insulating layer 330 may be removed underneath the light source 400.

A light leakage prevention layer 370 may be disposed in an area where a portion of the wiring insulating layer 330 is removed.

The light leakage prevention layer 370 may be the same as one of the insulating materials disposed on the substrate 310, which material may be opaque or have low transparency. For example, the light leakage prevention layer 370 may be made of the same material as the second passivation layer 360.

Alternatively, in some cases, the light leakage prevention layer 370 may be made of the same material as the wiring insulating layer 330 while being disposed with a thickness different from that of the wiring insulating layer 330.

Alternatively, in some cases, the light leakage prevention layer 370 may be made of an electrode material.

Thanks to the arrangement of the light leakage prevention layer 370, it will be possible to prevent light from leaking downwardly of the light source 400 even though the substrate 310 is transparent.

As described above, the embodiments of the present disclosure can provide a backlight unit having a structure in which the light source 400 is mounted on a single type of printed circuit 300, since the printed circuit 300 can be formed by means of depositing the wiring layers 320 and 340 on the substrate 310.

Furthermore, the embodiments of the present disclosure make it possible to implement the second wiring layer 340 contacting the light source 400 with multiple metal layers, thereby facilitating reworking of the light source 400 when any failure occurs in mounting of the light source 400.

Figure 4:
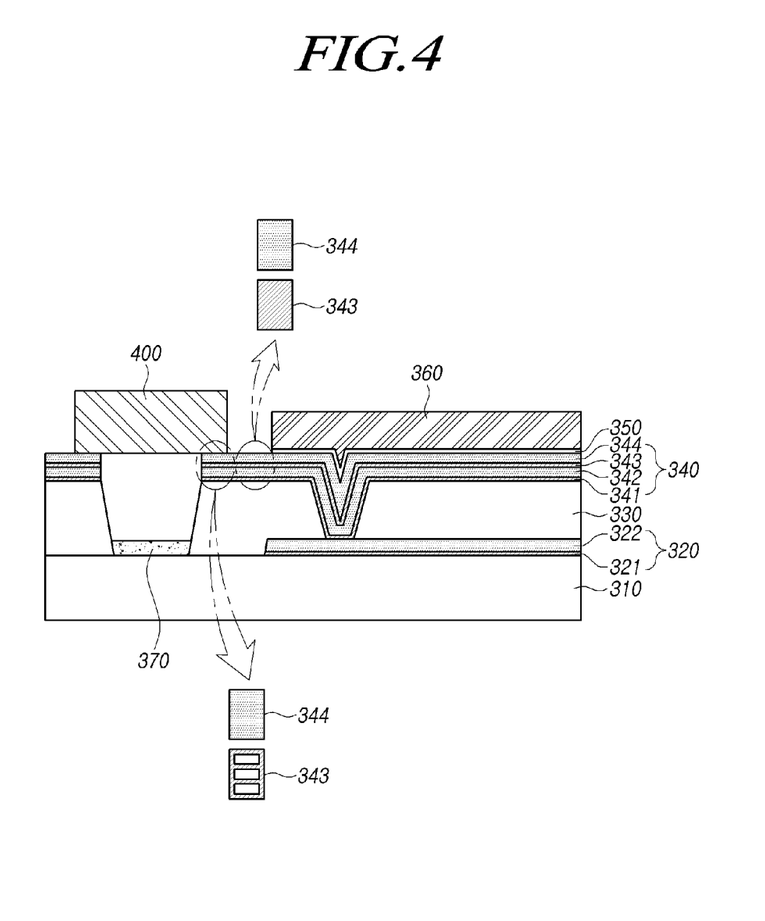
FIGS. 4 to 6 are diagrams illustrating other examples of a structure of a printed circuit included in a backlight unit according to embodiments of the present disclosure.
Figure 5:
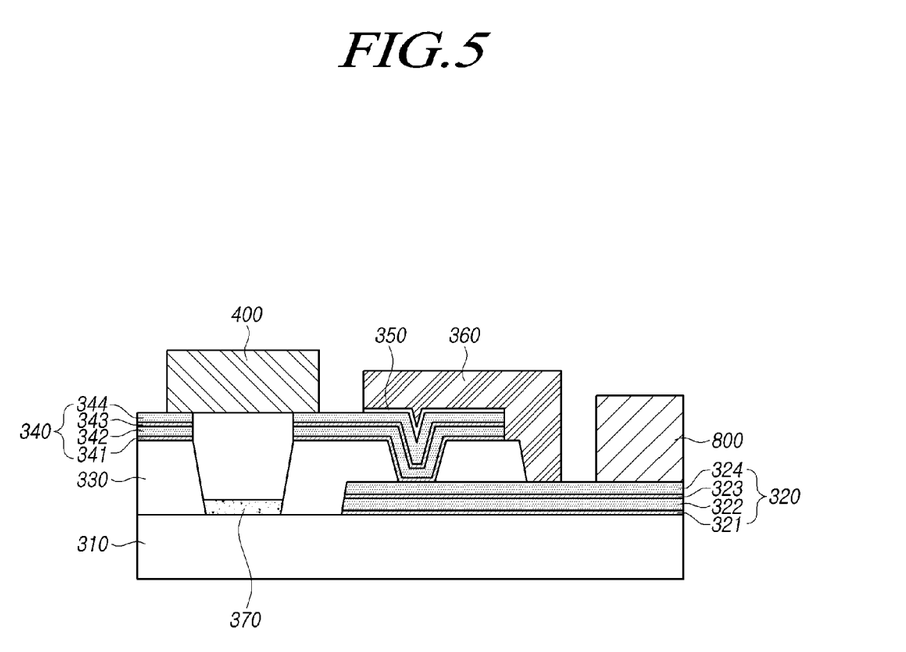
Figure 6:
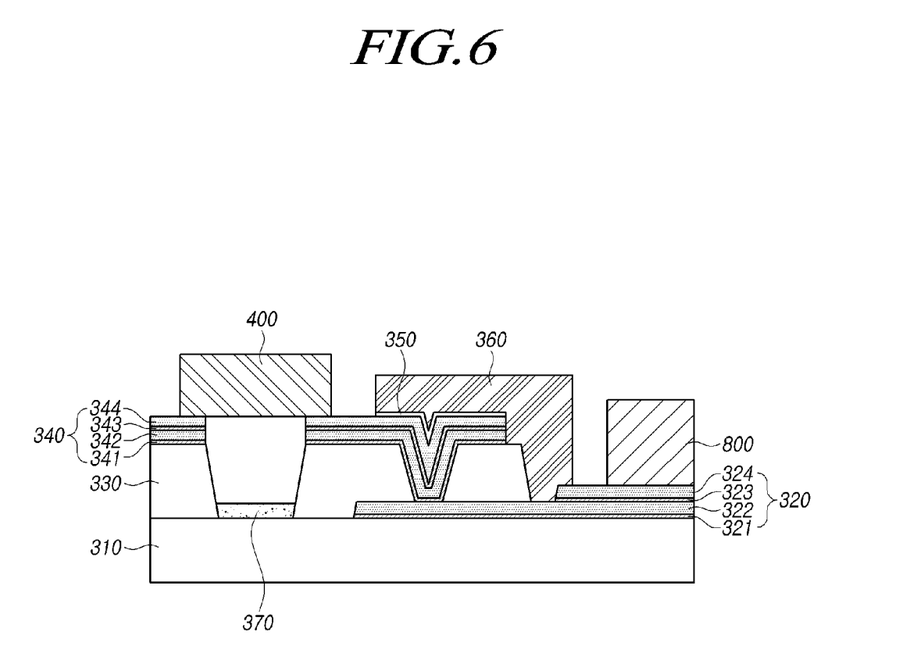

FIGS. 4 to 6 are views showing another example of the structure of the printed circuit 300 included in the backlight unit according to embodiments of the present disclosure.

Referring first to FIG. 4, the printed circuit 300 may include a substrate 310 and at least one wiring layer 320 and/or 340 disposed on the substrate 310. The substrate 310 may be made of a transparent material, as in the above-described example.

A first wiring layer 320 may be disposed on the substrate 310.

The first wiring layer 320 may include a first bonding metal layer 321 and a first wiring metal layer 322.

The first bonding metal layer 321 may be disposed on the substrate 310. The first bonding metal layer 321 may improve adhesiveness of the first wiring metal layer 322.

The first bonding metal layer 321 may be made of, for example, Mo, Ti, or MoTi, but is not limited thereto.

The first wiring metal layer 322 may be disposed on the first bonding metal layer 321.

The first wiring metal layer 322 may be formed to be thicker than the first bonding metal layer 321. The first wiring metal layer 322 may be electrically connected to a pad part 420 of the light source 400 to serve as a wiring.

The first wiring metal layer 322 may be deemed as a "main metal layer" of the first wiring layer 320. The first wiring metal layer 322 may be made of, e.g., Cu, but is not limited thereto.

A wiring insulating layer 330 may be disposed on the first wiring layer 320.

A second wiring layer 340 may be disposed on the wiring insulating layer 330. The second wiring layer 340 may be electrically connected to the first wiring layer 320 through a contact hole formed in the wiring insulating layer 330.

The second wiring layer 340 may include a plurality of bonding metal layers 341 and 343 and a plurality of wiring metal layers 342 and 344.

The second wiring layer 340 may include, for example, a first bonding metal layer 341, a first wiring metal layer 342, a second bonding metal layer 343, and a second wiring metal layer 344.

The first bonding metal layer 341 may be disposed on the wiring insulating layer 330, to improve the adhesiveness of the first wiring metal layer 342. The first bonding metal layer 341 may be made of, e.g., Mo, Ti, or MoTi, but is not limited thereto.

A first wiring metal layer 342 may be disposed on the first bonding metal layer 341. The first wiring metal layer 342 may be disposed to be thicker than the first bonding metal layer 341. The first wiring metal layer 342 may be made of, e.g., Cu, but is not limited thereto.

The first wiring metal layer 342 may be deemed as a "sub-metal layer".

A second bonding metal layer 343 may be disposed on the first wiring metal layer 342.

The second bonding metal layer 343 may be made of the same material as the first bonding metal layer 341. The second bonding metal layer 343 may be disposed to have a thickness similar to that of the first bonding metal layer 341.

The second bonding metal layer 343 may improve the adhesiveness of the second wiring metal layer 344 disposed on the second bonding metal layer 343.

The second wiring metal layer 344 may be disposed on the second bonding metal layer 343 and may be made of the same material as the first wiring metal layer 342. The second wiring metal layer 344 may be thicker than the second bonding metal layer 343.

The second wiring metal layer 344 may be deemed as a "main metal layer".

A first passivation layer 350 and a second passivation layer 360 may be disposed on the second wiring metal layer 344.

On the second wiring metal layer 344, the light source 400 may be mounted in an area where the first passivation layer 350 and the second passivation layer 360 are not disposed.

The light source 400 may be electrically connected to the second wiring metal layer 344. Further, an electrical signal for driving the light source 400 may be supplied via the first wiring layer 320 and the second wiring layer 340.

As the second wiring layer 340 includes a plurality of wiring metal layers 342 and 344, the plurality of wiring metal layers 342 and 344 may be disposed in an area overlapping the light source 400.

Here, the area overlapping the light source 400 may indicate an area in which the pad part 420 of the light source 400 is disposed.

The second wiring metal layer 344 of the second wiring layer 340 located in the area overlapping the light source 400 may be electrically connected to the pad part 420 of the light source 400. Accordingly, the second wiring metal layer 344 may serve as a "main metal layer".

When reworking of the light source 400 disposed on the second wiring metal layer 344 is required, at least a portion of the second wiring metal layer 344 may be removed by means of removing the light source 400.

The first wiring metal layer 342 positioned underneath the second wiring metal layer 344 is exposed to be electrically connected to the light source 400. That is, the first wiring metal layer 342 may serve as a "sub-metal layer".

To this end, in the area overlapping the light source 400, a portion of the second bonding metal layer 343 is removed so that the first wiring metal layer 342 of the second wiring layer 340 can be exposed during the reworking.

Then, in an area that does not overlap the light source 400, the second bonding metal layer 343 may be entirely disposed in order to improve adhesiveness between the first wiring metal layer 342 and the second wiring metal layer 344 included in the second wiring layer 340.

Further, the first bonding metal layer 341 positioned under the first wiring metal layer 342 may be entirely disposed between the wiring insulating layer 330 and the first wiring metal layer 342.

In other words, the first bonding metal layer 341 may be entirely disposed to improve adhesiveness, and the second bonding metal layer 343 may be partially disposed with its part being removed to expose the first wiring metal layer 342 during reworking while improving adhesiveness.

When the second bonding metal layer 343 is entirely removed from the area overlapping the light source 400, the first wiring metal layer 342 may be removed together with the second wiring metal layer 344 when the light source 400 is removed for reworking.

Accordingly, a portion of the second bonding metal layer 343 may be removed in the area overlapping the light source 400, while other portion may remain.

For example, the second bonding metal layer 343 may be removed in an area corresponding to 50% of the area overlapping the light source 400, while the second bonding metal layer 343 may remain in an area corresponding to its remaining 50%.

Further, in order to prevent removal of the first wiring metal layer 342 during the rework, the ratio of the area from which the second bonding metal layer 343 is removed may be less than a certain level (e.g., no more than 60%).

Further, a portion from which the second bonding metal layer 343 is removed in the area overlapping the light source 400 may be divided into several parts.

Increasing the area from which the second bonding metal layer 343 is removed to facilitate electrical connection between the light source 400 and the first wiring metal layer 342 during the rework, and arranging the second bonding metal layer 343 to be divided in a fixed pattern, will make it possible to prevent the first wiring metal layer 342 from being removed when the light source 400 is removed.

In addition, when at least one element other than the light source 400 is disposed on the second wiring layer 340, a portion of the second bonding metal layer 343 may be removed from an area overlapping the area where the at least one element is disposed.

Accordingly, the second wiring metal layer 344 may function as a "main metal layer" in the area where the corresponding element is disposed, and the first wiring metal layer 342 may function as a "sub-metal layer", so that the rework of the light source 400 as well as the element disposed on the second wiring layer 340 can be easily performed.

Furthermore, the embodiments of the present disclosure provide a method capable of performing reworking of elements electrically connected on the first wiring layer 320, by causing the first wiring layer 320 positioned underneath the wiring insulating layer 330 to include a plurality of wiring metal layers 321 and 323.

Referring then to FIG. 5, the first wiring layer 320 disposed on the substrate 310 may include a plurality of bonding metal layers 321 and 323 and a plurality of wiring metal layers 322 and 324.

The first wiring layer 320 may include, for example, a first bonding metal layer 321, a first wiring metal layer 322, a second bonding metal layer 323, and a second wiring metal layer 324.

A wiring insulating layer 330 may be disposed on the first wiring layer 320, and a second wiring layer 340 including a plurality of wiring metal layers 342 and 344 may be disposed on the wiring insulating layer 330.

At least one circuit element 800 may be disposed in an area where the wiring insulating layer 330 is not disposed on the first wiring layer 320. This circuit element 800 may be a circuit for driving the light source 400 or may indicate a connector portion to which the circuit is connected. That is, it may refer to any types of circuit elements that may be mounted on the first wiring layer 320.

A portion of the second bonding metal layer 323 may be removed from the area overlapping the circuit element 800 disposed on the first wiring layer 320. Further, another portion of the second bonding metal layer 323 may remain in the area overlapping the circuit element 800.

Hence, when performing a rework of the circuit element 800 disposed on the first wiring layer 320, the first wiring metal layer 322 may be exposed through the area where the second bonding metal layer 323 is removed even if the second wiring metal layer 324 is removed. Then, the circuit element 800 may be electrically connected to the first wiring metal layer 322, so that the reworking of the circuit element 800 can be carried out.

As described above, the embodiments of the present disclosure make it possible to facilitate reworking of the light source 400 or the circuit element 800 mounted on the wiring layers 320 and 340, by depositing at least one wiring layer 320 or 340 on the substrate 310 to form the printed circuit 300 and forming each of the wiring layers 320 and 340 in multiple layers.

Further, in the area where the light source 400 or the circuit element 800 is not mounted, in other words, in at least a portion of the region where no reworking is required, the layers forming the wiring layers 320 and 340 may be different.

Referring then to FIG. 6, on a substrate 310 may be disposed a first wiring layer 320, a wiring insulating layer 330, and a second wiring layer 340.

The first wiring layer 320 may include a plurality of bonding metal layers 321 and 323 and a plurality of wiring metal layers 322 and 324.

The second wiring layer 340 may include a plurality of bonding metal layers 341 and 343 and a plurality of wiring metal layers 342 and 344.

Here, the first wiring layer 320 disposed underneath the wiring insulating layer 330 may have a single bonding metal layer 321 and a single wiring metal layer 322.

Because a region where the first wiring layer 320 is located under the wiring insulating layer 330 is not the region on which the light source 400 or the circuit element 800 is mounted, only the bonding metal layer 321 and the first wiring metal layer 322 may be disposed.

Further, the first wiring metal layer 322 and the second wiring metal layer 324 may be disposed in an area where the wiring insulating layer 330 is not disposed and the circuit element 800 is to be mounted.

The second wiring layer 340 disposed on the wiring insulating layer 330 may be also arranged such that only the bonding metal layer 321 and the first wiring metal layer 342 may be disposed in some area where the light source 400 is not mounted, as circumstances require.

Embodiments of the present disclosure can provide a printed circuit 300 capable of reworking by means of arranging at least one of the wiring layers 320 and 340 disposed on the substrate 310 in multiple layers.

In addition, the embodiments of the present disclosure can provide a printed circuit 300 in which a sub-metal layer is exposed without being removed during the reworking, capable of being electrically connected to the light source 400 and so, by patterning and arranging a portion of the bonding metal layer positioned between the main metal layer and the sub-metal layer, in an area overlapping the light source 400 and the circuit element 800.

Figure 7:
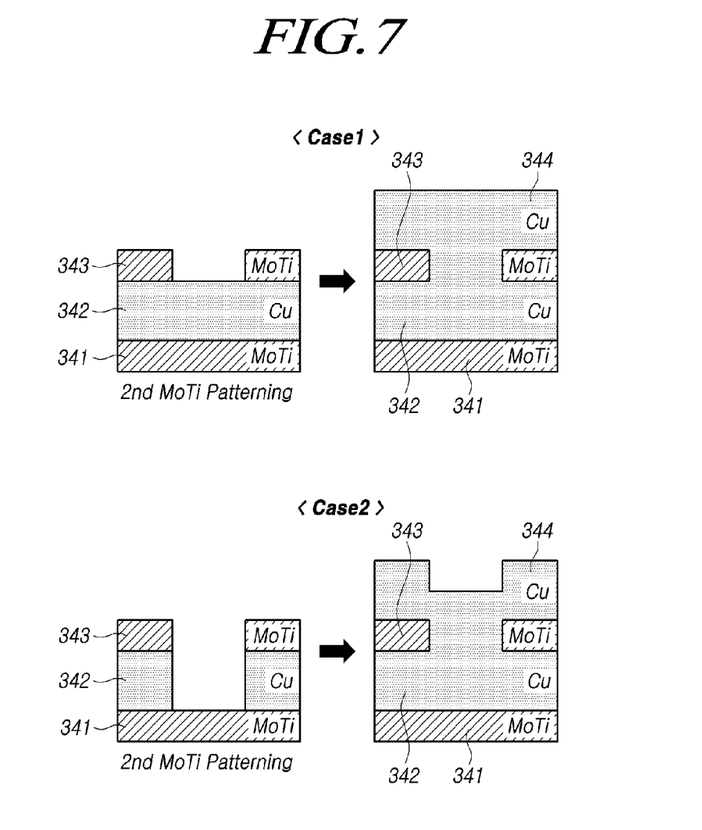
FIG. 7 is a diagram illustrating an example of a structure of a wiring layer included in a printed circuit according to embodiments of the present disclosure.

FIG. 7 is a diagram illustrating an example of the structure of a wiring layer included in the printed circuit 300 according to embodiments of the present disclosure, and in particular, shows an example of the structure of the second wiring layer 340. In addition, the first bonding metal layer 341 and the second bonding metal layer 343 may be made of e.g., MoTi, and the first wiring metal layer 342 and the second wiring metal layer 344 may be made of e.g., Cu.

Referring now to FIG. 7, for example, as in Case 1, the first wiring metal layer 342 and the second bonding metal layer 343 may be disposed on the first bonding metal layer 341. Further, a portion of the second bonding metal layer 343 may be patterned and removed.

Here, only the second bonding metal layer 343 may be removed while the first wiring metal layer 342 may not be removed.

The second wiring metal layer 344 may be disposed with a portion of the second bonding metal layer 343 being removed.

As such, the second wiring metal layer 344 and the first wiring metal layer 342 may be arranged in a coupled form. Further, when the second wiring metal layer 344 is removed during the reworking, the first wiring metal layer 342 may be exposed to provide a structure capable of electrically connecting to the light source 400 and the like.

As another example, as in Case 2, the first wiring metal layer 342 and the second bonding metal layer 343 may be disposed on the first bonding metal layer 341. When the second bonding metal layer 343 is patterned and removed, at least a portion of the first wiring metal layer 342 may be removed.

The second wiring metal layer 344 may be disposed on the second bonding metal layer 343, and a portion of the second wiring metal layer 344 may be disposed up to a region where the first wiring metal layer 342 is removed.

The second wiring metal layer 344 and the first wiring metal layer 342 may be disposed in a coupled form, and the first wiring metal layer 342 may be exposed during the reworking, so as to provide an electrical connection to the light source 400 and so on.

Figure 8:
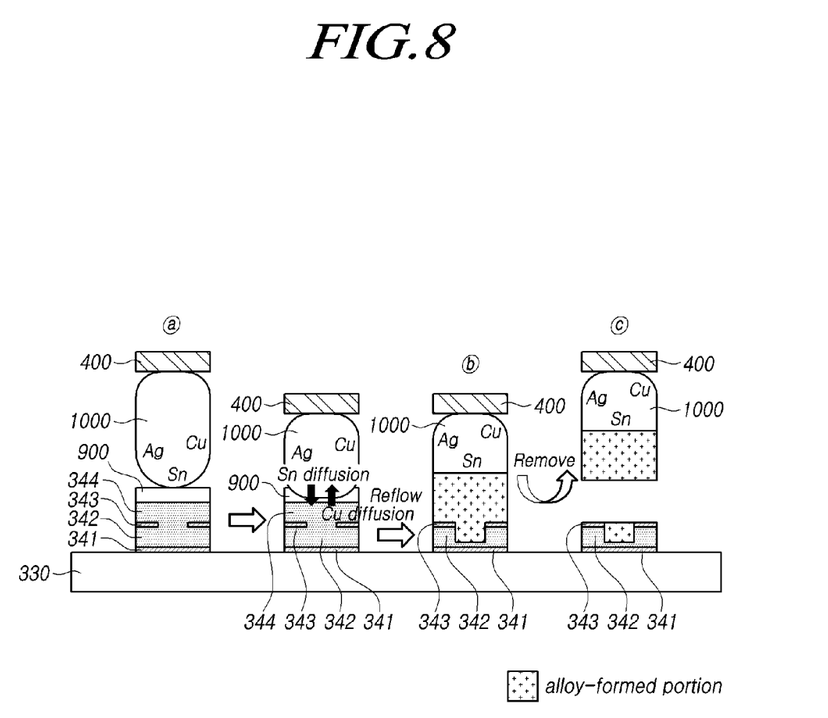
FIGS. 8 and 9 are diagrams illustrating examples of a process of mounting a light source on a printed circuit in manufacturing a backlight unit according to embodiments of the present disclosure.
Figure 9:
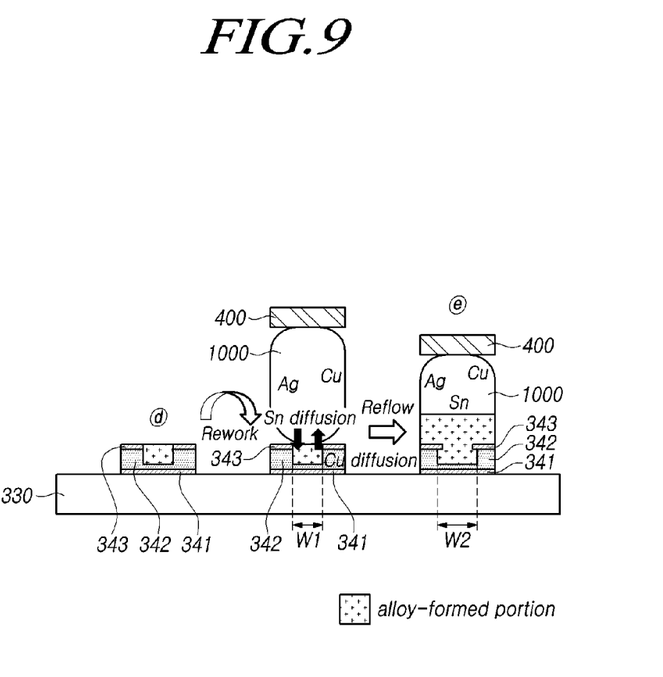

FIGS. 8 and 9 are diagrams illustrating an example of mounting the light source 400 on the printed circuit 300 in the process of manufacturing the backlight unit according to embodiments of the present disclosure.

Referring now to FIGS. 8 and 9, an example of a process of mounting the light source 400 on the second wiring layer 340 and performing the rework of the mounted light source 400 is shown.

Referring to a step (a) of FIG. 8, an anti-oxidation layer 900 may be disposed on the second wiring layer 340. A solder 1000 and a light source 400 may be then disposed on the anti-oxidation layer 900, so that a surface mount technology (SMT) can be carried out.

At this juncture, a portion of the second bonding metal layer 343 may be removed from the second wiring layer 340 positioned in the region where the light source 400 is mounted.

As the SMT progresses, for example, Sn included in the solder 1000 may diffuse, and Cu included in the second wiring layer 340 may diffuse.

As reflow proceeds, as shown in a step (b) of FIG. 8, a portion of the solder 1000 and the wiring metal layers 342 and 344 of the second wiring layer 340 form an alloy, so that the light source 400 can be fixed onto the second wiring layer 340.

The second wiring metal layer 344 positioned in the upper portion of the second wiring layer 340 may be in an alloy state.

Further, a portion of the first wiring metal layer 342 located in an area overlapping the area where the second bonding metal layer 343 is removed in the lower portion of the second wiring layer 340 may be in an alloy state.

In this way, with the light source 400 being mounted, the light source 400 may be removed as such a rework is required.

Referring then to a step (c) of FIG. 8, as the light source 400 is removed, only a portion disposed on the second bonding metal layer 343 of the alloy-formed portion may be removed. Further, as circumstances require, some of the alloy-formed portion may remain on the second bonding metal layer 343.

As seen in the example shown in FIG. 8, the first wiring metal layer 342 located underneath the second bonding metal layer 343 may remain even if the alloy-formed portion of the second wiring metal layer 344 located on the second bonding metal layer 343 is removed.

Then, an electrical connection to the light source 400 may be made using the first wiring metal layer 342, so that the light source 400 can be reworked.

Referring then to a step (d) of FIG. 9, once the layer positioned on the second bonding metal layer 343 has been removed, the solder 1000 and the light source 400 may be disposed to perform the SMT.

As the SMT progresses, Sn in the solder 1000 may diffuse, and Cu included in the second wiring layer 340 may diffuse.

As such, as seen in the example shown in a step (e) of FIG. 9, a portion of the solder 1000 and a portion of the first wiring metal layer 341 form an alloy state, thereby causing the light source 400 to be electrically connected to the second wiring layer 340.

Here, as the reflow proceeds while a portion of the first wiring metal layer 342 has been into an alloy state in the process prior to the rework, a region in which an alloy is formed by diffusion may be expanded.

For example, if a width of the portion where the alloy is formed in the first wiring metal layer 342 prior to the rework is W1, then a width of the portion where the alloy is formed in the first wiring metal layer 342 after the rework will be W2, which may be greater than W1.

At least a portion of the first wiring metal layer 342 positioned underneath the area overlapping the second bonding metal layer 343 may be in an alloy state by the rework process.

As described above, the alloy can be formed by diffusion, so that an electrical connection to the light source 400 may be formed via the first wiring metal layer 342 positioned under the second bonding metal layer 343.

According to the embodiments of the present disclosure, the second wiring layer 340 includes a plurality of wiring metal layers 342 and 344, and a portion of the second bonding metal layer 343 positioned between the plurality of wiring metal layers 342 and 344 is removed, thereby enabling the first wiring metal layer 342 positioned underneath the second bonding metal layer 343 to perform a function of a wiring for supplying a signal to the light source 400, during a rework.

In other words, when no rework is performed, the second wiring metal layer 344 positioned in the upper portion of the second wiring layer 340 may serve as a wiring, while when the rework is performed, the first wiring metal layer 342 disposed in the lower portion of the second wiring layer 340 may serve as a wiring.

Accordingly, a portion of the plurality of light sources 400 mounted on the printed circuit 300 may be in contact with the second wiring metal layer 344 of the second wiring layer 340, while other portion may be in contact with the first wiring metal layer 342 thereof.

Figure 10:
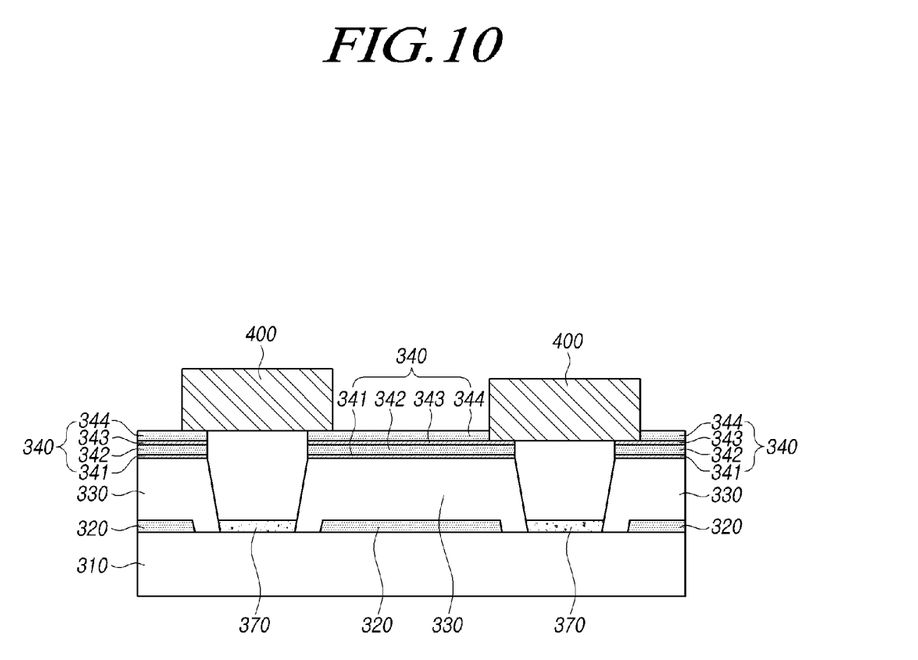
FIG. 10 is a diagram illustrating an example of a structure in which a light source is mounted on a printed circuit in a backlight unit according to embodiments of the present disclosure.

FIG. 10 is a diagram illustrating an example of a structure in which a light source 400 is mounted on a printed circuit 300 in a backlight unit according to embodiments of the present disclosure.

Referring now to FIG. 10, the light source 400 located on the left side of the light sources 400 mounted on the printed circuit 300 shows a case that it is mounted with no rework performed. Further, the light source 400 located on the right side thereof shows a case that it is mounted with the rework performed.

When no rework is performed, the light source 400 may contact the second wiring metal layer 344 of the second wiring layer 340 to form an electrical connection.

When the rework is performed, the light source 400 may contact the first wiring metal layer 342 of the second wiring layer 340 to form an electrical connection. Likewise, the light source 400 may contact the second bonding metal layer 343 positioned on the first wiring metal layer 342.

Alternatively, as circumstances demand, a portion of the second wiring metal layer 344 may remain on the second bonding metal layer 343, even when the rework is performed. In such a case, the light source 400 may be disposed abutting on the second wiring metal layer 344, but it may be disposed at a lower position than when no rework is performed.

According to the above-described embodiments of the present disclosure, the printed circuit 300 on which the light source 400 is mounted can be easily manufactured in one simple form, by manufacturing the printed circuit 300 by means of the process of depositing the wiring layers 320 and 340 on the substrate 310.

Further, it is possible to provide the printed circuit 300 in which the rework of the light source 400 or the circuit element 800 mounted on the printed circuit 300 can be easily performed, by forming at least a portion of the wiring layers 320 and 340 included in the printed circuit 300 in multiple layers.

Accordingly, it is possible to improve the efficiency of the process of mounting the light source 400 on the printed circuit 300 included in the backlight unit, thereby enhancing the production yield.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
a display panel; and
a backlight unit supplying light to the display panel,
wherein the backlight unit comprises:
a plurality of light sources; and
a printed circuit on which the plurality of light sources are mounted, and including one or more wiring layers;
wherein at least one of the one or more wiring layers comprises:
a main metal layer;
a sub-metal layer disposed underneath the main metal layer; and
a bonding metal layer disposed between the main metal layer and the sub-metal layer, a portion of which is removed in an area overlapping each of the plurality of light sources.

2. The display device of claim 1, wherein the bonding metal layer is disposed in a portion of the area overlapping each of the plurality of light sources.

3. The display device of claim 1, wherein at least a portion of the main metal layer is removed in the area overlapping at least one light source of the plurality of light sources.

4. The display device of claim 1, wherein a portion of the sub-metal layer located in an area overlapping the bonding metal layer in the area overlapping at least one light source of the plurality of light sources is in an alloy state.

5. The display device of claim 1, wherein at least a portion of the main metal layer in the area overlapping at least one light source of the plurality of light sources is in an alloy state.

6. The display device of claim 5, wherein at least a portion of the sub-metal metal layer located in an area overlapping the area in which the bonding metal layer is removed in the area overlapping at least one light source of the plurality of light sources is in an alloy state.

7. The display device of claim 1, wherein at least one light source of the plurality of light sources is in contact with the main metal layer, and at least one other light source of the plurality of light sources is in contact with the sub-metal layer.

8. The display device of claim 1, wherein at least one light source of the plurality of light sources is in contact with the bonding metal layer.

9. The display device of claim 1, wherein there are a plurality of areas with the bonding metal layer being removed in the area overlapping each of the plurality of light sources, and the plurality of areas are spaced apart from each other.

10. The display device of claim 1, wherein the main metal layer and the sub-metal layer are made of the same material, and the main metal layer and the sub-metal layer are made of a material different from the bonding metal layer.

11. The display device of claim 1, wherein a thickness of the main metal layer and a thickness of the sub-metal layer are greater than a thickness of the bonding metal layer.

12. The display device of claim 1, further comprising at least one circuit element located in an area other than the area overlapping the plurality of light sources, and being mounted on the wiring layer,
wherein a portion of the bonding metal layer is removed from an area overlapping the at least one circuit element.

13. The display device of claim 1, wherein the printed circuit comprises:
a substrate;
a first wiring layer disposed on the substrate;
a wiring insulating layer disposed on the first wiring layer; and
a second wiring layer disposed on the wiring insulating layer;
wherein at least one of the first wiring layer and the second wiring layer comprises the main metal layer and the sub-metal layer.

14. The display device of claim 13, wherein the first wiring layer comprises the main metal layer and the sub-metal layer, and
the main metal layer of the first wiring layer is disposed in an area other than the area in which the wiring insulating layer is disposed.

15. The display device of claim 14, wherein a portion of the sub-metal layer of the first wiring layer is disposed underneath the wiring insulating layer and is electrically connected to the second wiring layer.

16. A backlight unit, comprising:
a plurality of light sources; and
a printed circuit on which the plurality of light sources are mounted, and including one or more wiring layers;
wherein at least one of the one or more wiring layers comprises:
a main metal layer;
a sub-metal layer disposed underneath the main metal layer; and a bonding metal layer disposed between the main metal layer and the sub-metal layer, a portion of which is removed in an area overlapping each of the plurality of light sources.

17. A printed circuit comprising:

a substrate; and one or more wiring layers disposed on the substrate;

wherein at least one of the one or more wiring layers comprises;

a first bonding metal layer;

a sub-metal layer disposed on the first bonding metal layer;

a second bonding metal layer disposed on the sub-metal layer; and a main metal layer disposed on the second bonding metal layer, wherein the first bonding metal layer is entirely disposed underneath the sub-metal layer, and the second bonding metal layer is removed from a partial area between the main metal layer and the sub-metal layer.

* * * * *